United States Patent
Huang et al.

(10) Patent No.: US 7,452,660 B1
(45) Date of Patent: *Nov. 18, 2008

(54) METHOD FOR RESIST STRIP IN PRESENCE OF LOW K DIELECTRIC MATERIAL AND APPARATUS FOR PERFORMING THE SAME

(75) Inventors: Zhisong Huang, Fremont, CA (US); Reza Sadjadi, Saratoga, CA (US)

(73) Assignee: Lam Research Corporation, Fremont, CA (US)

( * ) Notice: Subject to any disclaimer, the term of this patent is extended or adjusted under 35 U.S.C. 154(b) by 708 days.

This patent is subject to a terminal disclaimer.

(21) Appl. No.: 10/916,685

(22) Filed: Aug. 11, 2004

(51) Int. Cl.
*G03F 7/00* (2006.01)
*B44C 1/22* (2006.01)

(52) U.S. Cl. .................. 430/329; 430/330; 216/67; 216/69; 510/176; 438/708; 438/710

(58) Field of Classification Search .......... 430/329, 430/330; 216/67, 69; 134/1.1, 1.3, 1.2; 510/176; 438/708, 710
See application file for complete search history.

(56) References Cited

U.S. PATENT DOCUMENTS

| | | | | |
|---|---|---|---|---|
| 5,696,429 A | * | 12/1997 | Williamson et al. | 315/111.51 |
| 6,777,173 B2 | * | 8/2004 | Chen et al. | 430/329 |
| 2002/0197870 A1 | * | 12/2002 | Johnson | 438/689 |
| 2003/0104320 A1 | * | 6/2003 | Nguyen et al. | 430/313 |

* cited by examiner

*Primary Examiner*—Thorl Chea
(74) *Attorney, Agent, or Firm*—Martine Penilla & Gencarella, LLP

(57) ABSTRACT

A method and apparatus is provided for using a plasma generated from a processing gas mixture including $H_2O$ to efficiently strip photoresist material without causing significant damage to exposed, underlying low k dielectric material. The method includes disposing the processing gas mixture including the $H_2O$ over the wafer. The processing gas mixture including the $H_2O$ is then transformed into a plasma. The plasma serves to remove the photoresist material from the substrate without adversely affecting the exposed low k dielectric material.

13 Claims, 7 Drawing Sheets

METHOD FOR RESIST STRIP IN PRESENCE OF LOW K DIELECTRIC MATERIAL AND APPARATUS FOR PERFORMING THE SAME

CROSS REFERENCE TO RELATED APPLICATIONS

This application is related to U.S. patent application Ser. No. 10/232,635, filed on Aug. 30, 2002, and entitled "$H_2O$ Vapor as a Processing Gas for Crust, Resist, and Residue Removal for Post Ion Implant Resist Strip." The disclosure of this related application is incorporated herein by reference.

BACKGROUND OF THE INVENTION

1. Field of the Invention

The present invention relates to semiconductor fabrication.

2. Description of the Related Art

During semiconductor fabrication, integrated circuits are created on a semiconductor wafer ("wafer") composed of a material such as silicon. To create the integrated circuits on the wafer, it is necessary to fabricate a large number (e.g., millions) of electronic devices such as resistors, diodes, capacitors, and transistors of various types. Fabrication of the electronic devices involves depositing, removing, and implanting materials at precise locations on the wafer. A process called photolithography is commonly used to facilitate deposition, removal, and implantation of materials at precise locations on the wafer.

In the photolithography process, a photoresist material is first deposited onto the wafer. The photoresist material is then exposed to light filtered by a reticle. The reticle is generally a glass plate that is patterned with exemplary feature geometries that block light from passing through the reticle. After passing through the reticle, the light contacts the surface of the photoresist material. The light changes the chemical composition of the exposed photoresist material. With a positive photoresist material, exposure to the light renders the exposed photoresist material insoluble in a developing solution. Conversely, with a negative photoresist material, exposure to the light renders the exposed photoresist material soluble in the developing solution. After the exposure to the light, the soluble portions of the photoresist material are removed, leaving a patterned photoresist layer.

The wafer is then processed to either remove, deposit, or implant materials in the wafer regions not covered by the patterned photoresist layer. After the wafer processing, the patterned photoresist layer is removed from the wafer in a process called photoresist stripping. It is important to completely remove the photoresist material during the photoresist stripping process because photoresist material remaining on the wafer surface may cause defects in the integrated circuits. Also, the photoresist stripping process should be performed carefully to avoid chemically modifying or physically damaging underlying materials present on the wafer.

SUMMARY OF THE INVENTION

In one embodiment, a method for removing photoresist material from a substrate is disclosed. The method includes providing a substrate having a photoresist material overlying a low k dielectric material, wherein a portion of the low k dielectric material is exposed. The method also includes disposing $H_2O$ vapor over the substrate. The method further includes transforming the $H_2O$ vapor into a reactive form, wherein the reactive form affects a removal of the photoresist material from the substrate without causing substantial removal of the low k dielectric material exposed to the reactive form.

In another embodiment, a method for operating a photoresist stripping chamber is disclosed. The method includes placing a wafer within an internal volume of the photoresist stripping chamber, wherein the wafer has a photoresist material overlying a low k dielectric material. A portion of the low k dielectric material is exposed to the internal volume of the photoresist stripping chamber. The method also includes supplying $H_2O$ vapor to the internal volume of the photoresist stripping chamber. The method further includes applying power to the $H_2O$ vapor to transform the $H_2O$ vapor into a plasma including plasma ions. Additionally, the method includes allowing the plasma ions to react with the photoresist material. Reaction of the plasma ions serve to remove the photoresist material from the wafer without adversely affecting the low k dielectric material exposed to the internal volume of the photoresist stripping chamber.

In another embodiment, a photoresist stripping chamber ("chamber") is disclosed. The chamber includes an internal region configured to contain a plasma. A wafer support structure is disposed within the internal region. The wafer support structure is configured to hold a wafer in exposure to the plasma. The chamber also includes an $H_2O$ vapor supply inlet configured to supply $H_2O$ vapor to the internal region. A power supply is also provided for transforming the $H_2O$ vapor within the internal region into the plasma. The plasma includes ions capable of removing photoresist material from the wafer without adversely affecting a low k dielectric material present on the wafer and exposed to the plasma.

Other aspects and advantages of the invention will become more apparent from the following detailed description, taken in conjunction with the accompanying drawings, illustrating by way of example the present invention.

BRIEF DESCRIPTION OF THE DRAWINGS

The invention, together with further advantages thereof, may best be understood by reference to the following description taken in conjunction with the accompanying drawings in which.

DETAILED DESCRIPTION

Figure 1:
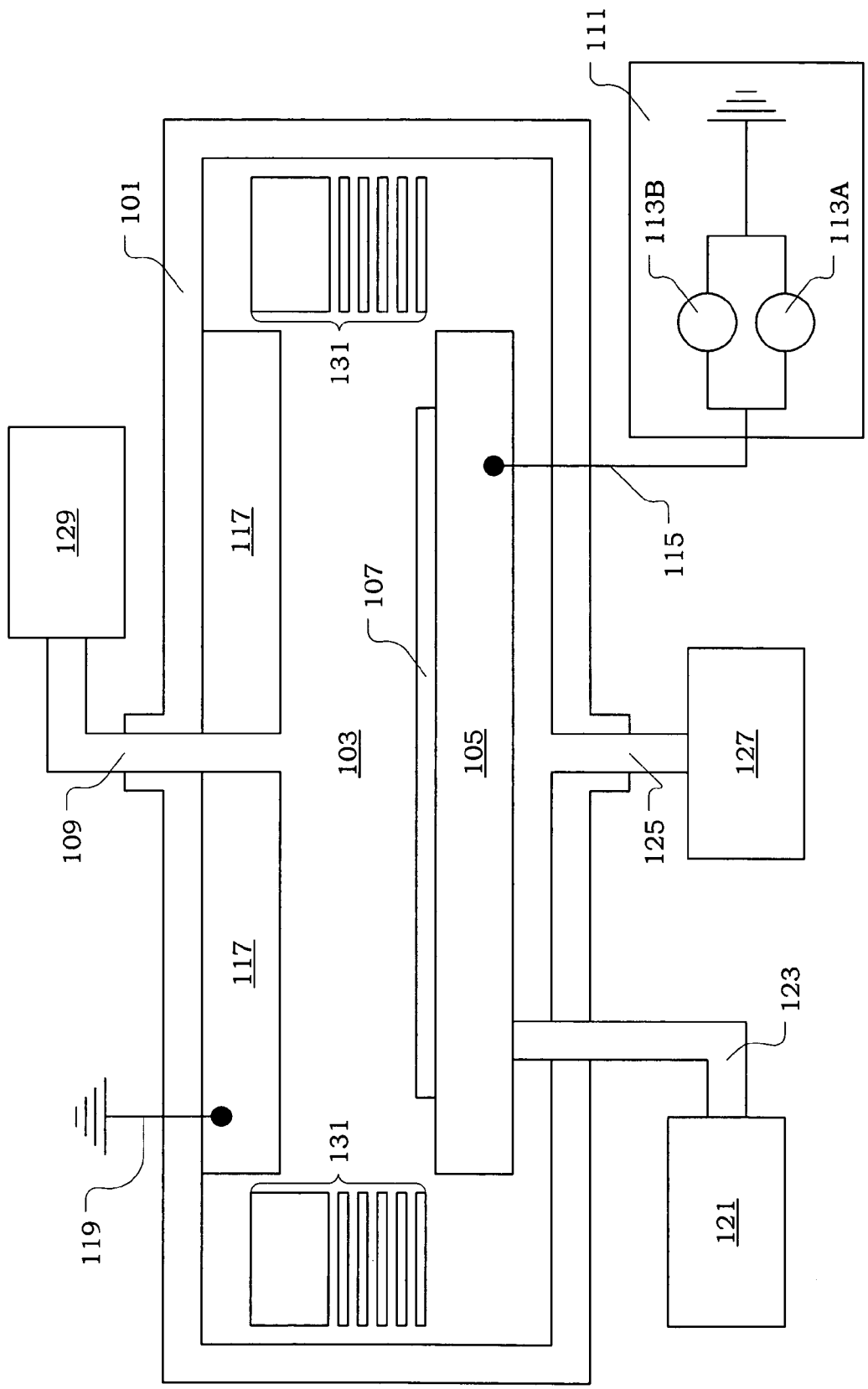
FIG. 1 is an illustration showing a plasma etching chamber ("chamber"), in accordance with one embodiment of the present invention.

An invention is disclosed for a method and apparatus for using $H_2O$ vapor plasma, generated from a processing gas including $H_2O$ vapor, to strip photoresist material from a wafer, wherein the photoresist material is disposed over a low k dielectric material on the wafer surface. Both the photoresist and the low k material are configured to be exposed to the $H_2O$ vapor plasma during a photoresist stripping process. Use of the $H_2O$ vapor plasma allows the photoresist material and post etch residues to be efficiently stripped without adversely affecting the exposed low k material. Also, the $H_2O$ vapor represents a safe, efficient, and economical processing gas.

In the following description, numerous specific details are set forth in order to provide a thorough understanding of the present invention. It will be apparent, however, to one skilled in the art that the present invention may be practiced without some or all of these specific details. In other instances, well known process operations have not been described in detail in order not to unnecessarily obscure the present invention.

Advanced integrated circuits often use a low k dielectric material as an electrical insulator between adjacent conductor lines, i.e., as an interlayer dielectric material. Low k dielectric materials are defined as insulating materials having a k value less than that of $SiO_2$, i.e., a k value less than about 3.9. Use of the low k dielectric materials reduces undesired capacitive coupling, i.e., crosstalk, between adjacent conductor lines.

To form integrated circuit structures on a wafer, it is often necessary to subject the low k dielectric material to a plasma etching process. In plasma etching of a low k dielectric layer on a wafer, a photoresist mask layer is commonly used to form a mask pattern over the low k dielectric layer. The mask pattern serves to protect the underlying low k material from being removed during the plasma etching process. Once the plasma etching process is completed and the corresponding mask pattern is formed in the low k dielectric layer, the photoresist material and associated residue needs to be removed from the wafer. Also, it should be appreciated that once the plasma etching process is completed, portions of the remaining low k dielectric material will be exposed. Removal of the photoresist material from the wafer can be accomplished by performing a photoresist stripping process on the wafer. However, the photoresist stripping process needs to performed in a manner that will not adversely affect the exposed low k dielectric material.

The desirable low k property of the low k dielectric material is often achieved by methods such as doping the dielectric material with elements such as C, H, O, F, etc., and/or forming microscopic holes, i.e., pores, in the dielectric material. Dielectric modifications employed to create the low k dielectric material often leave the resulting low k dielectric material more vulnerable to damage during a plasma-based photoresist stripping process. For example, commonly used photoresist stripping methods rely primarily on reagents such as $O_2$, $H_2$, $N_2$, or a mixture thereof, that are very reactive upon plasma excitation. Thus, the $O_2$, $H_2$, $N_2$, or associated mixtures, are prone to react chemically with elements in the low k dielectric material, thus adversely modifying the low k dielectric material. Consequently, portions of the low k dielectric material having been so adversely modified during the photoresist stripping process are removed from the wafer along with the photoresist material. Additionally, use of processing gases such as $O_2$ and $H_2$ involves special requirements and safety features which can increase the capital cost of the wafer fabrication process.

One method for achieving selective removal of photoresist materials involves use of $H_2$ in a downstream microwave discharge reactor. This method exploits a slightly lower chemical reactivity of C,H-containing functional groups (for example, in the form of $CH_3$) included in the low k dielectric material relative to a chemical reactivity of the photoresist material. This method requires use of an ion-deficient medium, such as that provided by a downstream microwave source, in conjunction with elevated temperatures to promote stripping reactions. A lack of ions in the ion-deficient medium can result in a less than desirable photoresist strip rate. Additionally, since a portion of photoresist materials and post-etch residues can be less reactive than other portions, the downstream microwave discharge reactor method may not be capable of completely removing the less reactive portions, thus allowing photoresist stripping residues to remain.

Additionally, one method for reducing dielectric profile sidewall damage caused by the photoresist stripping process involves use of anisotropic plasma etching conditions. By exploiting directionality of an anisotropic plasma stripping process, the photoresist mask materials can be stripped without damaging the underlying low k dielectric materials. It should be appreciated that the underlying low k dielectric materials are often covered by a damage-resistant cap layer. This method for using the anisotropic plasma etching conditions usually requires a low pressure and often includes use of a stripping plasma generated from $O_2$, $N_2$, $H_2$, or a combination thereof. Additionally, use of the stripping plasma generated from $O_2$, $N_2$, $H_2$ in this method requires use of a sidewall passivant, which serves to deposit polymer materials on the dielectric profile sidewall surface to prevent damage. It should be appreciated that the method for using anisotropic plasma etching conditions does not prevent damage to dielectric material surfaces that are not oriented to be substantially parallel to an ion impact trajectory of the incident plasma. Also, in the method for using anisotropic plasma etching conditions, post-etch residues on the dielectric profile sidewall may not be cleaned efficiently.

In contrast to the downstream microwave discharge reactor method and the anisotropic plasma etching method described above, the present invention mitigates damage to low k dielectric materials by exploiting a difference between plasma stripping mechanisms of the photoresist materials and damage mechanisms of the low k dielectric materials. It should be appreciated that during the photoresist stripping process, a photoresist etch front is being continuously refreshed as the photoresist material is being stripped away, i.e., as photoresist material is removed, fresh underlying photoresist material is exposed. In contrast, low k dielectric materials typically are not physically removed during a photoresist stripping process. Damage to low k dielectric materials occurs when chemical reactions occurring on the low k dielectric material surface propagates deep into a bulk of the low k dielectric material. Therefore, it is important that a proper photoresist stripping chemistry be selected to enable photoresist stripping reactions to occur under ion bombardment while avoiding modification of the bulk of the low k dielectric material. Selection of the proper photoresist stripping chemistry is facilitated by recognizing that excitation by ion bombardment does not penetrate into solid materials beyond a skin depth (e.g., <5 nm). Since ion penetration within the skin depth occurs prior to the stripping process, i.e., occurs during the etching process, the stripping process can be performed without causing further damage to the low k dielectric materials.

In accordance with one embodiment of the present invention, a relatively less reactive chemical, such as $H_2O$, is chosen as a major component of the stripping plasma mixture. Additionally, in accordance with the present invention, the reactivity of the stripping plasma mixture can be further reduced with addition of chemicals such as hydrocarbons ($CH_2$, $C_2H_4$, etc.) that can remove highly reactive species (such as free O radicals) from the stripping plasma mixture. Furthermore, in accordance with the present invention, the temperature of the low k dielectric materials can be maintained sufficiently low to further reduce reactivity of the stripping plasma mixture towards the low k dielectric materials. It should be appreciated that the reduction of stripping plasma mixture reactivity, as indicated above, has a minor impact on photoresist stripping rate due to the photoresist stripping reactions being primarily driven by ion bombardment.

In accordance with the foregoing discussion, the present invention provides a method and apparatus by which a stripping plasma, generated from a processing gas mixture including $H_2O$, can be used to efficiently strip the photoresist material without causing significant damage to the exposed, underlying low k dielectric material. For purposes of discussion, the stripping plasma generated from the processing gas mixture including $H_2O$ will be referred to herein as "$H_2O$ vapor plasma." The chemical reagent released by plasma excitation of the processing gas mixture can selectively remove photoresist material under ion bombardment without chemically modifying the low k dielectric material. In one embodiment, the $H_2O$ vapor plasma is at least 10 times more reactive towards the photoresist material than the low k dielectric material. Also, the $H_2O$ vapor plasma can be safely struck in the vicinity of the wafer, thus allowing ions in the plasma to affect the photoresist stripping process with a corresponding increase the photoresist stripping efficiency. Therefore, with the present invention photoresist materials and post-etch residues can be efficiently removed from the wafer without damaging the low k dielectric material.

FIG. 1 is an illustration showing a plasma etching chamber ("chamber") 101, in accordance with one embodiment of the present invention. In one embodiment, the plasma etching chamber 101 can be utilized as a photoresist stripping chamber. Within the chamber 101, a top electrode 117 is disposed over an internal region 103 within which a plasma is to be generated. In one embodiment, the top electrode 117 is electrically connected to ground as indicated by a connection 119. Also, a wafer support structure 105 is disposed within the internal region 103 to hold a wafer 107 in exposure to the plasma. In one embodiment, the wafer support structure 105 is an electrostatic chuck.

In one embodiment the wafer support structure 105 is defined to have a number of cooling channels configured to connect with a heat exchanger 121 as indicated by a connection 123. The heat exchanger 121 is capable of being operated to maintain a temperature of the wafer support structure 105. Since the wafer 107 is in contact with the wafer support structure 105, the temperature of the wafer 107 can be controlled via the temperature of the wafer support structure 105. The chamber 101 further includes a processing gas supply inlet 109 connected to a processing gas source 129. The processing gas supply inlet 109 is configured to supply a processing gas to the internal region 103 of the chamber 101. Additionally, the chamber 101 includes a vacuum source 127 connected to internal region 103 of the chamber 101 through a vacuum port 125. The vacuum source 127 is capable of generating and maintaining a partial vacuum pressure within the internal region 103 of the chamber 101.

In one embodiment, the wafer support structure 105 is connected to a power supply 111. The power supply 111 includes a first radio frequency (RF) generator 113A and a second RF generator 113B. In one embodiment, the first RF generator 113A provides a low frequency RF current, such as 2 megahertz (MHz), and the second RF generator 113B provides a high frequency RF current, such as 27 MHz. The frequencies of 2 MHz and 27 MHz are provided for exemplary purposes. In other embodiments, the RF generators 113A/113B can be defined to generate RF currents having different frequencies suited to a particular process to be performed on the wafer 107. It should be appreciated that matching circuits are included downstream of each of the first and second RF generators 113A/113B, with appropriate filters to prevent signal reflections. The power supply 111, i.e., RF generators 113A/113B, are connected to the wafer support structure 105 as indicated by a connection 115. Thus, in addition to supporting the wafer 107 in exposure to the plasma, the wafer support structure 105 also serves as an RF-driven electrode.

During operation of the chamber 101, RF current is transferred from the wafer support structure 105 to the top electrode 117. Thus, power is transferred by capacitive coupling to processing gases present within the internal region 103 intervening between the wafer support structure 105 and the top electrode 117. The transferred power, i.e., RF current, acts on the processing gases to generate the plasma to which the wafer 107 is exposed. The plasma contains various types of radicals, as well as positive and negative ions. Exposure of particular materials on the wafer 107 to the plasma results in chemical reactions that serve to remove the particular materials from the wafer 107. Also, it should be appreciated that the electrical relationship between the wafer support structure, i.e., the RF-driven electrode 105, and the top electrode 117 causes a bias voltage to be established within the internal region 103 intervening between the wafer support structure 105 and the top electrode 117. The bias voltage acts to attract ions within the plasma toward the wafer support structure 105, and hence toward the wafer 107. The ions contact the wafer 107 and react to remove photoresist materials present on the wafer 107 surface.

The plasma etching chamber 101 also includes a set of confinement rings 113 disposed around a periphery of a plasma region within which the plasma 111 is to be generated. In addition to confining the plasma, the set of confinement rings 131 also serve to control a pressure within the plasma region. In the chamber 101, processing gases flow through gaps between adjacent confinement rings to exit the plasma region. The set of confinement rings 131 can be moved to increase and decrease a spacing or gap between adjacent confinement rings. Thus, movement of the set of confinement rings 131 serves to adjust a flow area provided for processing gas egress from the plasma region. Adjustment of the flow area for processing gas egress can be used to control pressure within the plasma region. During operation of the chamber 101, the set confinement rings 131 are moved to maintain a target pressure within the plasma region.

In one embodiment of the present invention, $H_2O$ vapor is used as the processing gas in the chamber 100 to strip the photoresist material from the wafer 107. In another embodiment, the processing gas used in the chamber is defined as $H_2O$ vapor in combination with an additive gas. In various embodiments, the additive gas can be CO, $C_2H_4$, $CO_2$, $CH_4$, Ar, He, or a combination thereof.

In one embodiment, a partial vacuum pressure in the plasma region is established and maintained within a range extending from about 0.010 torr to about 1 torr. As used herein, the term "about" means within ±10% of a specified value. In another embodiment, the partial vacuum pressure in the plasma region is established and maintained within a range extending from about 0.010 torr to about 2 torr. In yet another embodiment, the partial vacuum pressure in the plasma region is established and maintained within a range extending from about 0.001 torr to about 20 torr.

In one embodiment, $H_2O$ vapor is supplied to the internal region 103 at a flow rate within a range extending from about 100 standard cubic centimeters per minute (sccm) to about 1000 sccm. In another embodiment, $H_2O$ vapor is supplied to the internal region 103 at a flow rate within a range extending from about 50 sccm to about 1000 sccm. In yet another embodiment, $H_2O$ vapor is supplied to the internal region 103 at a flow rate within a range extending from about 50 sccm to about 3000 sccm.

In one embodiment, RF current is applied to the $H_2O$ vapor within the internal region 103 at a power level within a range extending from about 100 Watts (W) to about 600 W. In another embodiment, RF current is applied to the $H_2O$ vapor within the internal region 103 at a power level within a range extending from about 100 W to about 1000 W. In yet another embodiment, RF current is applied to the $H_2O$ vapor within the internal region 103 at a power level within a range extending from about 50 W to about 2000 W.

In one embodiment, the temperature of the wafer support structure 105 is maintained within a range extending from about −100° C. to about 25° C. In another embodiment, the temperature of the wafer support structure 105 is maintained within a range extending from about −100° C. to about 50° C. In yet another embodiment, the temperature of the wafer support structure 105 is maintained at less than about 100° C. The photoresist stripping rate increases with higher wafer support structure 105/wafer 107 temperatures. Also, the low k dielectric material damage is reduced at lower wafer support structure 105/wafer 107 temperatures. The bias voltage present during the stripping process serves to attract plasma ions to the wafer impacting an activation energy despite lower thermal activation caused by reduced temperatures. Therefore, the $H_2O$ vapor plasma stripping process of the present invention can be performed at lower temperatures to further protect the low k dielectric material without sacrificing photoresist stripping efficiency.

The photoresist material strip rate afforded by the $H_2O$ vapor plasma stripping process of the present invention is dependent upon the stripping process parameters as described above. In various embodiments, photoresist material strip rates can be expected within a range extending from about 1500 Å per minute (Å/min) to about 20000 Å/min, depending on process parameters.

The $H_2O$ vapor plasma stripping process of the present invention is demonstrated through a number of experiments. In the experiments, the photoresist stripping effectiveness of a number of different processing gas chemistries are tested in the chamber 100. The principle experimental parameters include processing gas chemistry, wafer support structure temperature, internal region pressure, RF power applied to generate the plasma, and processing gas flow rate. The experimental results are characterized in terms of an amount of low k dielectric material lost on each exposed surface, i.e., side, of the low k dielectric feature after a decoration step. The decoration step removes only the damaged layer of the low k dielectric materials. Table 1 shows a summary of the principle experimental parameters and results for the tested processing gas chemistries.

TABLE 1

Summary of Experimental Parameters and Results

| Case | Processing Gas Chemistry | Wafer Support Structure Temperature (° C.) | Internal Region Pressure (torr) | Power (W) | Processing Gas Flow Rate (sccm) | Loss of Low k Material (nanometers) |
|---|---|---|---|---|---|---|
| 1 | $H_2O$ | −40 | 860 | 300 | 500 | About 0 |
| 2 | $H_2O$ | −20 | 860 | 300 | 500 | About 0 |
| 3 | $H_2:O_2$ | −40 | 860 | 200 | 500 $H_2$ 250 $O_2$ | About 230 |
| 4 | $H_2:O_2$ | −20 | 860 | 200 | 500 $H_2$ 250 $O_2$ | About 350 |
| 5 | $H_2O$ | 20 | 860 | 300 | 500 | About 25 |
| 6 | $H_2:O_2$ | 20 | 860 | 200 | 500 $H_2$ 250 $O_2$ | About 620 |
| 7 | $O_2$ | 20 | 860 | 300 | 500 | About 380 |

Figure 2:
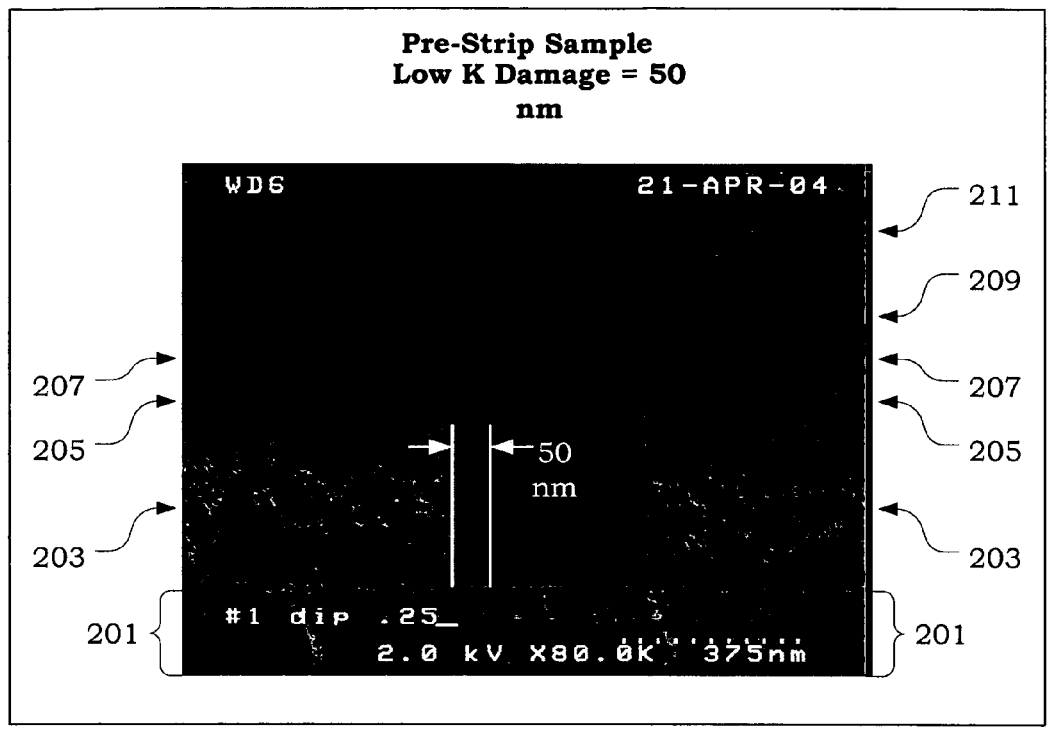
FIG. 2 is an illustration showing an image of a sample wafer surface prior to performing the photoresist stripping experiments shown in Table 1.

FIG. 2 is an illustration showing an image of a sample wafer surface prior to performing the photoresist stripping experiments shown in Table 1. The sample wafer surface includes a substrate portion 201. A low k dielectric layer 203 is disposed on the substrate portion 201. A SiC layer 205 is disposed on the low k dielectric layer 203. A Tetraethyl Orthosilicate, $Si(OC_2H_5)_4$, (TEOS) layer 207 is disposed on the SiC layer 205. A Bottom Antireflective Coating (BARC) layer 209 is disposed on the TEOS layer 207. A photoresist layer 211 is disposed on the BARC layer 209. Since the sample wafer surface has been subjected to a low k dielectric etching process, portions of the low k dielectric layer 203 underlying the photoresist layer 211 have been exposed. More specifically, a trench has been formed through each of the material layers down to the substrate portion 201. Thus, the low k dielectric is defined to have a side wall. As shown in FIG. 2, 50 nanometers (nm) has been removed from the low k material side wall during previously processing of the wafer. Therefore, for the photoresist stripping experiments, a baseline loss of low k dielectric is 50 nm due to damage. The results presented in Table 1 reflect the loss of low k dielectric material due solely to the photoresist stripping process, i.e., excluding the baseline loss. However, for ease of presentation, the visual depictions of the experimental results as shown in FIGS. 3 through 8 show the total low k dielectric loss, including the baseline loss. The wafer surface depicted in FIG. 2 is representative of a sample wafer used for experimental purposes. Therefore, the present invention is not intended to be limited to wafer surface configurations like that of FIG. 2. It should be appreciated that the $H_2O$ vapor plasma stripping process of the present invention can be performed on essentially any wafer wherein a photoresist material needs to be removed in the presence of an exposed low k dielectric material.

Figure 3:
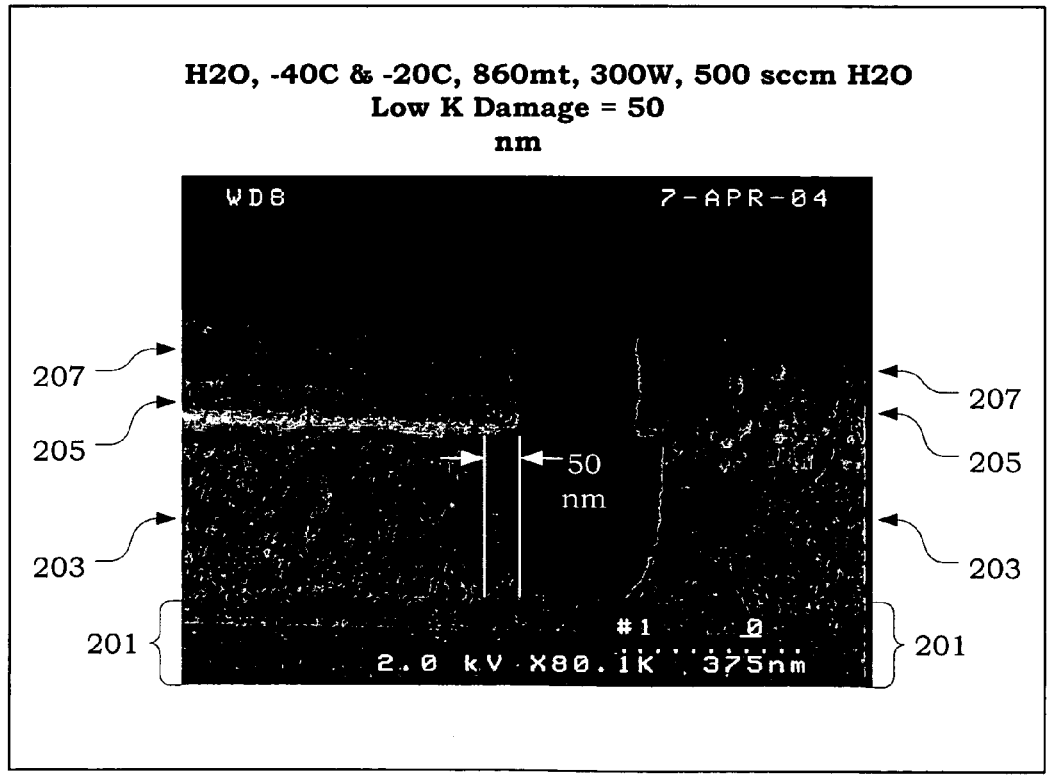
FIG. 3 is an illustration showing an image of the sample wafer surface of FIG. 2 following performance of the Case 1 and 2 photoresist stripping experiments, as described in Table 1.

As shown in Cases 1 and 2 from Table 1, use of $H_2O$ vapor to strip the photoresist material at temperatures of −40° C. and −20° C. results in essentially no loss of low k material. FIG. 3 is an illustration showing an image of the sample wafer surface of FIG. 2 following performance of the Case 1 and 2 photoresist stripping experiments, as described in Table 1.

Figure 4:
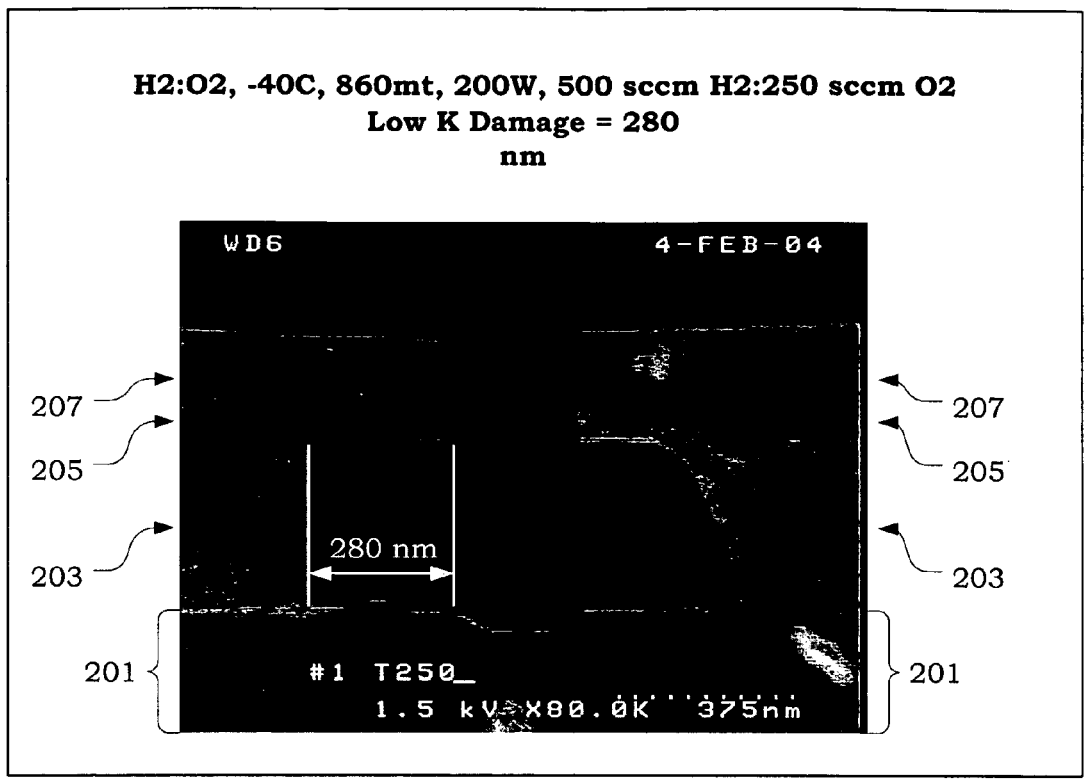
FIG. 4 is an illustration showing an image of the sample wafer surface of FIG. 2 following performance of the Case 3 photoresist stripping experiment, as described in Table 1.

As shown in Case 3 from Table 1, use of the $H_2:O_2$ processing gas to strip the photoresist material at a temperature of −40° C. causes a 230 nm loss of low k dielectric material, as compared to essentially no loss with the $H_2O$ vapor. FIG. 4 is an illustration showing an image of the sample wafer surface of FIG. 2 following performance of the Case 3 photoresist stripping experiment, as described in Table 1.

Figure 5:
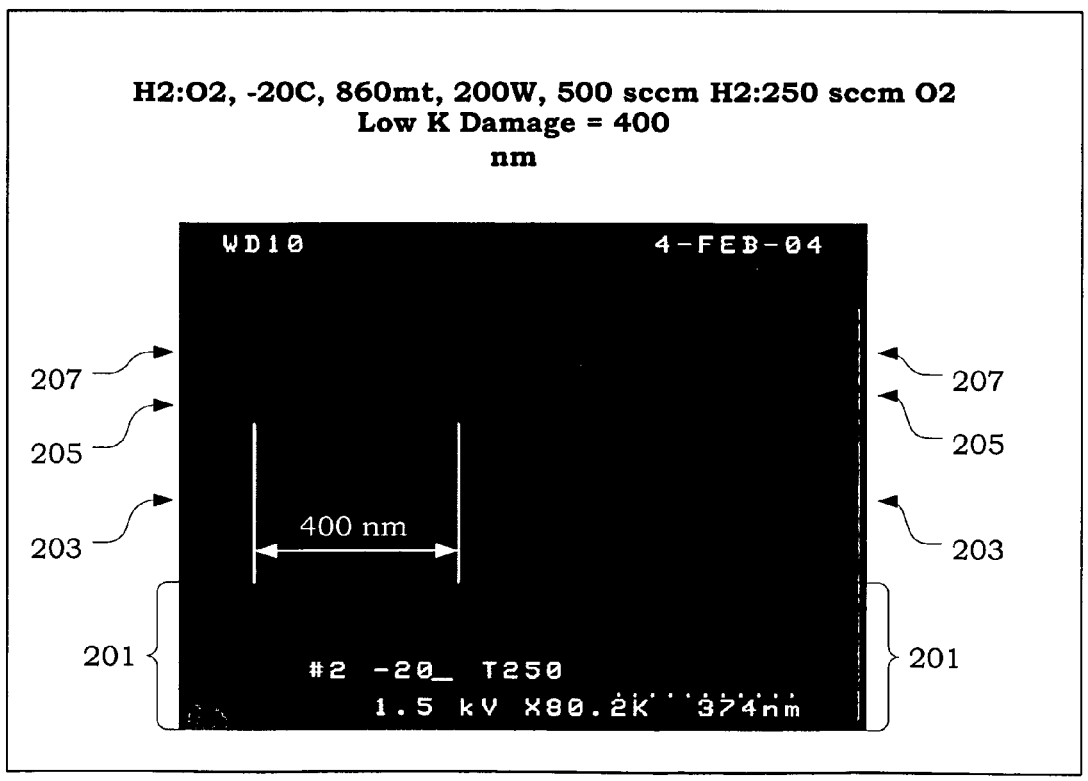
FIG. 5 is an illustration showing an image of the sample wafer surface of FIG. 2 following performance of the Case 4 photoresist stripping experiment, as described in Table 1.

As shown in Case 4 from Table 1, use of the $H_2:O_2$ processing gas to strip the photoresist material at a temperature of −20° C. causes a 350 nm loss of low k dielectric material, as compared to essentially no loss with the $H_2O$ vapor. FIG. 5 is an illustration showing an image of the sample wafer surface of FIG. 2 following performance of the Case 4 photoresist stripping experiment, as described in Table 1.

Figure 6:
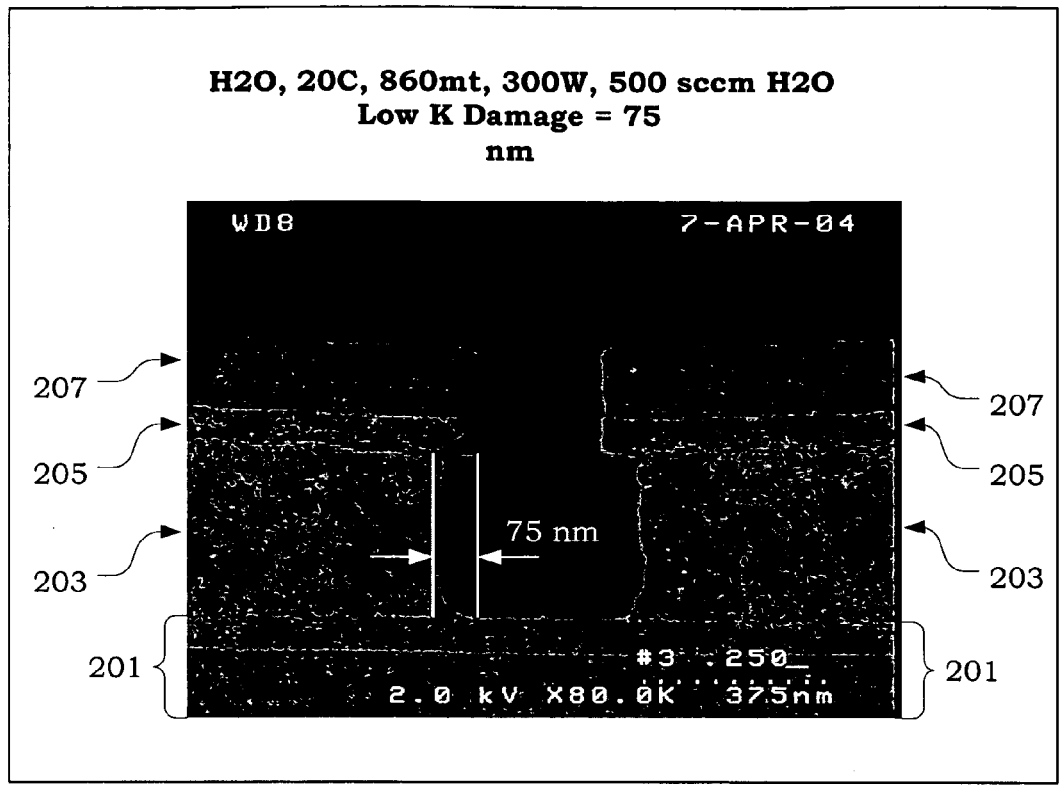
FIG. 6 is an illustration showing an image of the sample wafer surface of FIG. 2 following performance of the Case 5 photoresist stripping experiment, as described in Table 1.

As shown in Case 5 from Table 1, use of the $H_2O$ vapor to strip the photoresist material at a temperature of 20° C. causes a 25 nm loss of low k dielectric material. FIG. 6 is an illustration showing an image of the sample wafer surface of FIG. 2 following performance of the Case 5 photoresist stripping experiment, as described in Table 1.

Figure 7:
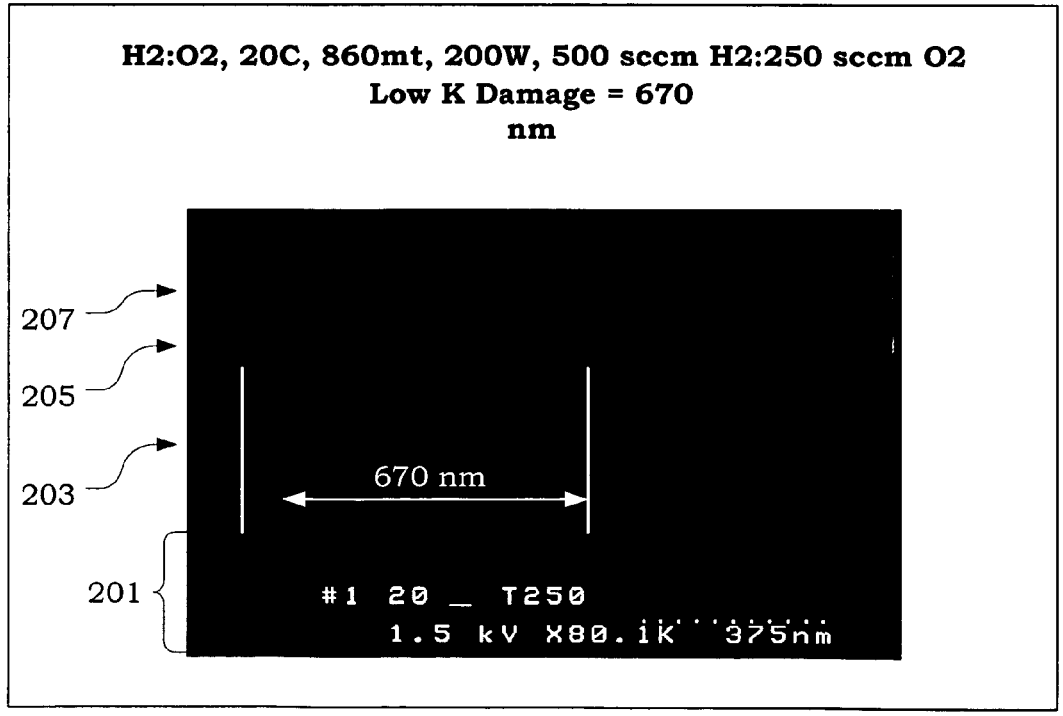
FIG. 7 is an illustration showing an image of the sample wafer surface of FIG. 2 following performance of the Case 6 photoresist stripping experiment, as described in Table 1.

As shown in Case 6 from Table 1, use of the $H_2:O_2$ processing gas to strip the photoresist material at a temperature of 20° C. causes a 620 nm loss of low k dielectric material, as compared to the 25 nm loss with the $H_2O$ vapor. FIG. 7 is an illustration showing an image of the sample wafer surface of FIG. 2 following performance of the Case 6 photoresist stripping experiment, as described in Table 1.

Figure 8:
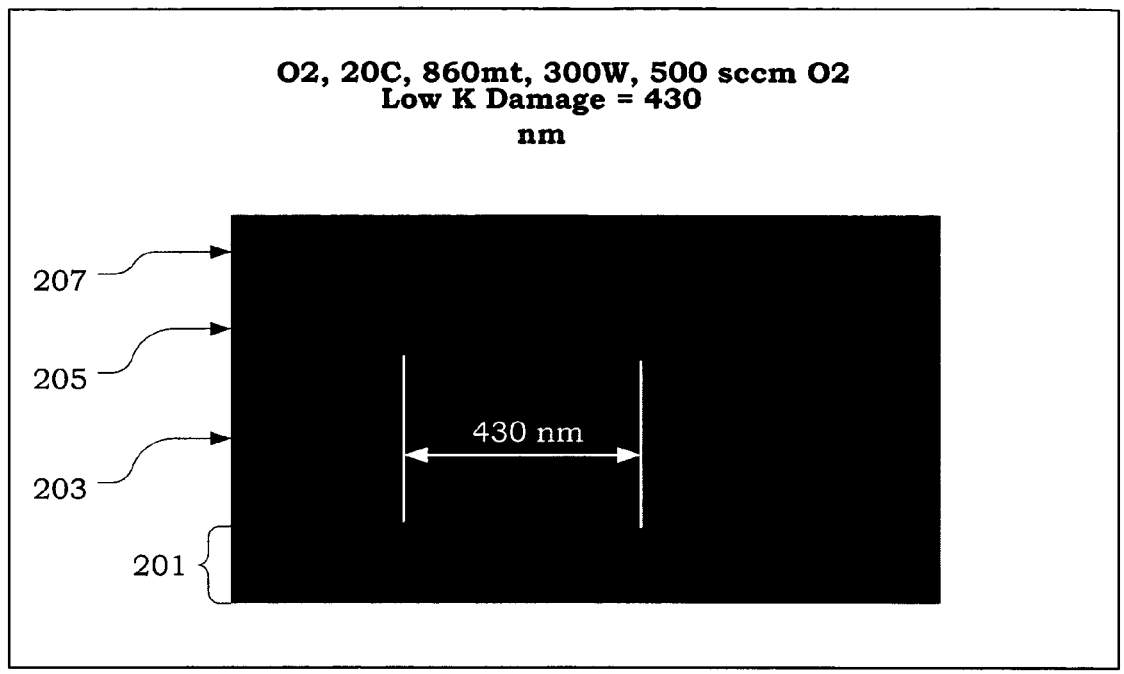
FIG. 8 is an illustration showing an image of the sample wafer surface of FIG. 2 following performance of the Case 7 photoresist stripping experiment, as described in Table 1.

As shown in Case 7 from Table 1, use of the $O_2$ processing gas to strip the photoresist material at a temperature of 20° C. causes a 380 nm loss of low k dielectric material, as compared to the 25 nm loss with the $H_2O$ vapor. FIG. 8 is an illustration showing an image of the sample wafer surface of FIG. 2 following performance of the Case 7 photoresist stripping experiment, as described in Table 1.

Figure 9:
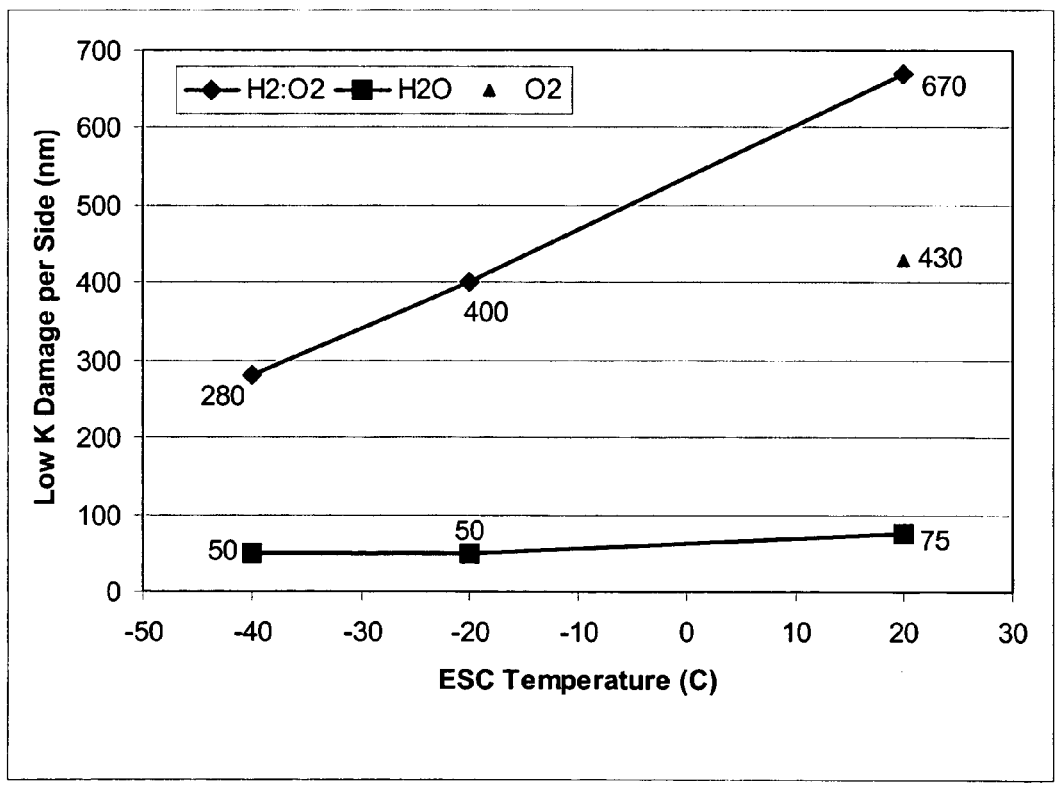
FIG. 9 is an illustration showing a chart of the experimental results as described above with respect to Table 1 and FIGS. 3-8.

FIG. 9 is an illustration showing a chart of the experimental results as described above with respect to Table 1 and FIGS. 3-8. As demonstrated by the experimental results, as the wafer temperature increases, the low k dielectric material becomes more reactive with the plasma. Also, the $H_2O$ vapor plasma, as opposed to the $H_2:O_2$ and $O_2$ plasmas, is not very reactive with the low k dielectric material at low temperatures. However, plasma ions of the $H_2O$ vapor plasma will enable reaction with the photoresist material at lower temperatures. Therefore, it is beneficial to perform the $H_2O$ vapor plasma stripping process at lower temperatures. Thus, at lower temperatures the $H_2O$ vapor plasma stripping process of the present inventions relies upon reactive ion etching to remove the photoresist material. Also, the present invention leverages the inability of the reactive ion etching to penetrate deeply into the low k material at low temperatures. For benefits of stripping at a higher temperature, chemicals such as the hydrocarbons can be added to the processing gas mixture to reduce stripping damage.

Though the present invention has been described primarily in the context of a capacitively coupled plasma etching chamber, it should be appreciated that the $H_2O$ vapor plasma stripping process of the present invention can be performed in any chamber where the plasma can be established in the vicinity of the wafer, thus allowing the ions in the plasma to activate reactions with the photoresist material. For example, in another embodiment, the $H_2O$ vapor plasma stripping process of the present invention can be performed in an inductively coupled plasma etching chamber.

Figure 10:
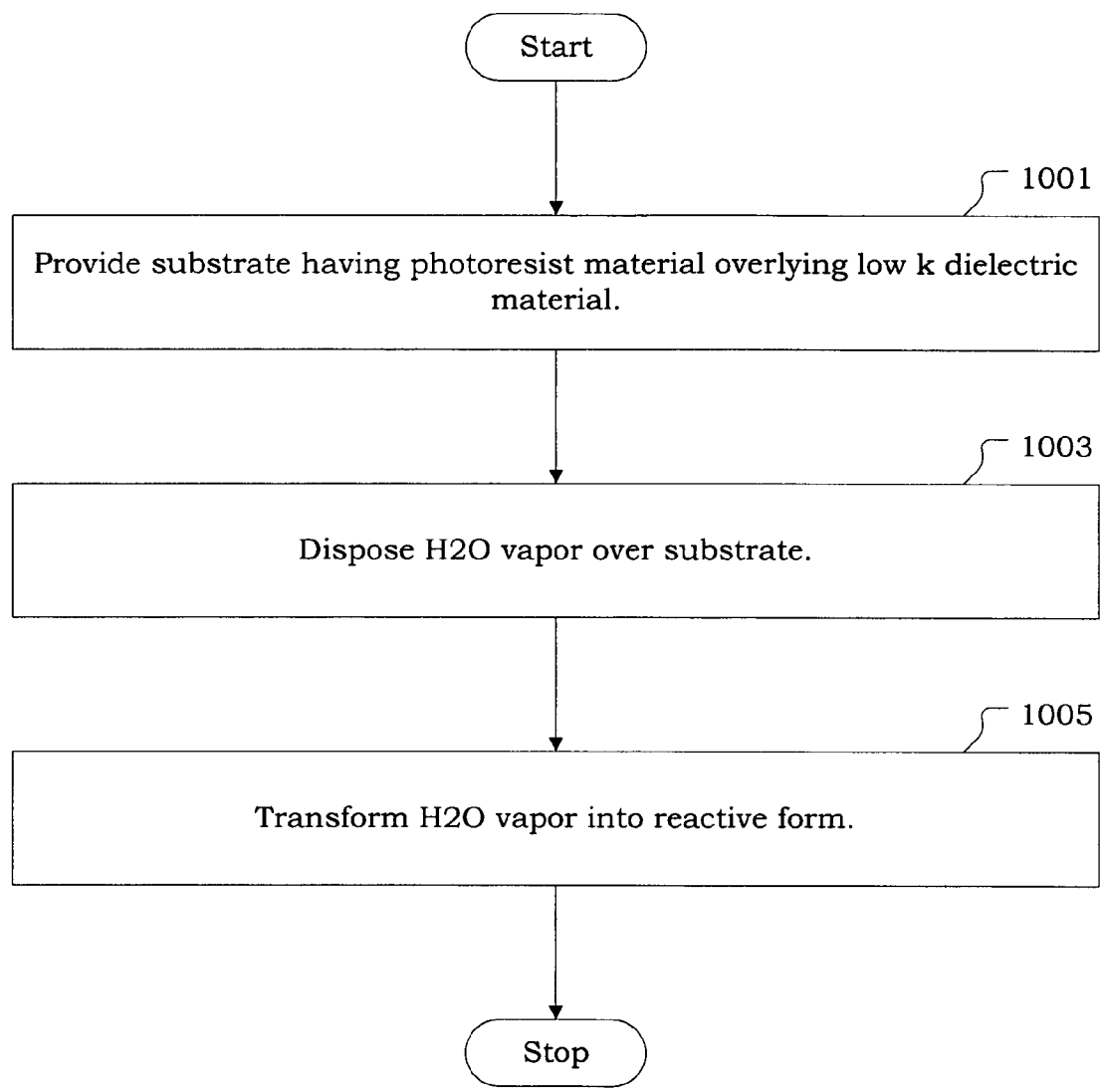
FIG. 10 is an illustration showing a flowchart of a method for removing photoresist material from a substrate, i.e., wafer, in accordance with one embodiment of the present invention.

FIG. 10 is an illustration showing a flowchart of a method for removing photoresist material from a substrate, i.e., wafer, in accordance with one embodiment of the present invention. The method includes an operation 1001 for providing a substrate having a photoresist material overlying a low k dielectric material, wherein a portion of the low k dielectric material is exposed. The method also includes an operation 1003 for disposing an $H_2O$ vapor over the substrate. In one embodiment, the $H_2O$ vapor is disposed over the substrate at a flow rate within a range extending from about 50 sccm to about 3000 sccm. In another embodiment the $H_2O$ vapor flow rate is within range extending from about 50 sccm to about 1000 sccm. In yet another embodiment the $H_2O$ vapor flow rate is within a range extending from about 100 sccm to about 1000 sccm. Also, the $H_2O$ vapor can be disposed over the substrate as a component of a multiple gas mixture. In various embodiments, the multiple gas mixture can include, in addition to the $H_2O$ vapor, either CO, $C_2H_4$, $CO_2$, $CH_4$, Ar, He, or a combination thereof.

The method further includes an operation 1005 for transforming the $H_2O$ vapor into a reactive form, wherein the reactive form affects a removal of the photoresist material from the substrate without causing detrimental removal of the low k dielectric material. In one embodiment, the $H_2O$ vapor plasma is generated through application of RF power within a range extending from about 50 W to about 2000 W. In another embodiment, the RF power can be applied within a range extending from about 100 W to about 1000 W. In yet another embodiment, the RF power can be applied within a range extending from about 100 W to about 600 W.

The method can also include controlling a temperature of the substrate. In various embodiments, the temperature of the substrate can be maintained within either of the following temperature ranges: less than about 100° C., less than about 20° C., less than about 0° C., less than about −20° C., less than about −40° C., between about −100° C. and about 50° C., between about −100° C. and about 25° C.

Additionally, the method can include generating a partial vacuum pressure within a volume containing the substrate and $H_2O$ vapor. In one embodiment, the partial vacuum pressure is established within a range extending from about 0.001 torr to about 20 torr. In another embodiment, the partial vacuum pressure is established within a range extending from about 0.010 torr to about 2 torr. In yet another embodiment, the partial vacuum pressure is established within a range extending from about 0.010 torr to about 1 torr.

Figure 11:
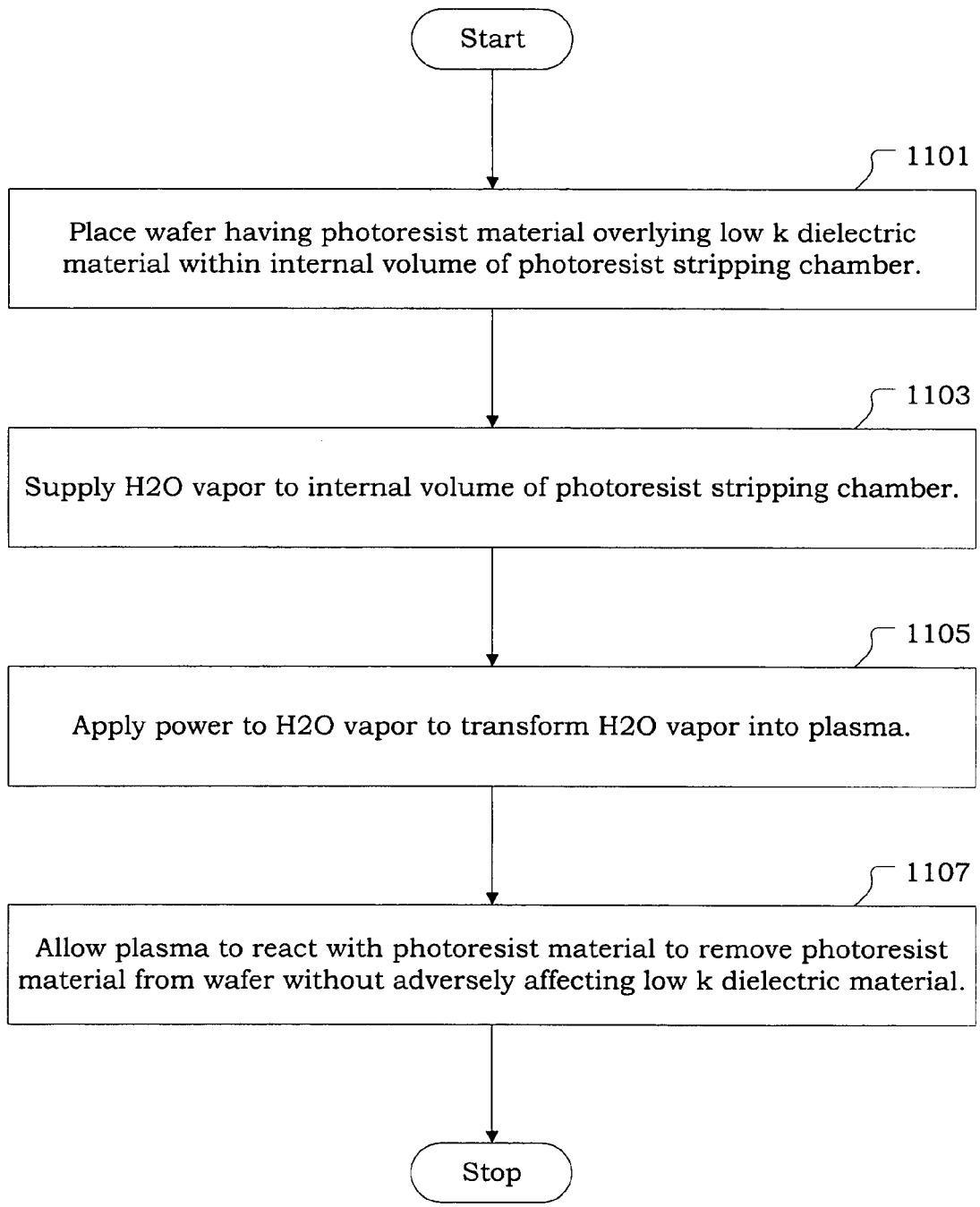
FIG. 11 is an illustration showing a flowchart of a method for operating a photoresist stripping chamber, in accordance with one embodiment of the present invention.

FIG. 11 is an illustration showing a flowchart of a method for operating a photoresist stripping chamber, in accordance with one embodiment of the present invention. The method includes an operation 1101 for placing a wafer within an internal volume of the photoresist stripping chamber. The wafer is defined to have a photoresist material overlying a low k dielectric material, wherein a portion of the low k dielectric material is exposed. The method also includes an operation 1103 for supplying $H_2O$ vapor to the internal volume of the photoresist stripping chamber. In various embodiments, the $H_2O$ vapor can be supplied to the internal volume of the photoresist stripping chamber at flow rates within the corresponding flow rate ranges previously discussed with respect to the method of FIG. 10. Also, as previously discussed with respect to FIG. 10, the $H_2O$ vapor can be supplied as part of a multiple gas mixture.

The method further includes an operation 1105 for applying power to the $H_2O$ vapor to transform the $H_2O$ vapor into a plasma mixture including plasma ions. In various embodiments, the power can be applied the $H_2O$ vapor within the corresponding power ranges previously discussed with respect to the method of FIG. 10. In an operation 1107 of the method, plasma ions are allowed to activate reactions with the photoresist material. The reaction with the photoresist material serves to remove the photoresist material from the wafer without adversely affecting the low k dielectric material, wherein adversely affecting the low k dielectric material corresponds to increasing an electrical conductivity of the low k dielectric material, altering a geometry of the low k dielectric material, or altering physical properties of the low k dielectric material. In one embodiment of the method, the $H_2O$ vapor plasma is controlled to achieve a photoresist material-to-low k dielectric material stripping selectivity of at least 10 to 1.

The method can also include operations for controlling a temperature and/or generating a partial vacuum pressure within the internal volume of the photoresist stripping chamber. In various embodiment, the temperature can be controlled within the corresponding temperature ranges previously discussed with respect to the method of FIG. 10. Also, in various embodiments, the partial vacuum pressure can be generated within the corresponding ranges previously discussed with respect to the method of FIG. 10.

While this invention has been described in terms of several embodiments, it will be appreciated that those skilled in the art upon reading the preceding specifications and studying the drawings will realize various alterations, additions, permutations and equivalents thereof. Therefore, it is intended that the present invention includes all such alterations, additions, permutations, and equivalents as fall within the true spirit and scope of the invention.

What is claimed is:

1. A method for removing photoresist material from a substrate, comprising:
    providing a substrate having a photoresist material overlying a low k dielectric material, the low k dielectric material having an exposed portion;
    maintaining a temperature of the substrate at less than about 20° C.;
    disposing an $H_2O$ vapor over the substrate; and
    transforming the $H_2O$ vapor into a reactive form, wherein the reactive form affects a removal of the photoresist material from the substrate without causing substantial removal of the low k dielectric material at the exposed portion.

2. A method for removing photoresist material from a substrate as recited in claim 1, further comprising:
    maintaining a temperature of the substrate within a range extending from about −100° C. to about 20° C.

3. A method for removing photoresist material from a substrate as recited in claim 1, further comprising:
    generating a partial vacuum pressure within a volume containing the substrate and $H_2O$ vapor, the partial vacuum pressure being within a range extending from about 0.001 torr to about 20 torr.

4. A method for removing photoresist material from a substrate as recited in claim 1, wherein the $H_2O$ vapor is disposed over the substrate at a flow rate within a range extending from about 50 standard cubic centimeters per minute (sccm) to about 3000 sccm.

5. A method for removing photoresist material from a substrate as recited in claim 1, wherein transforming the $H_2O$ vapor into a reactive form is performed using a radio frequency (RF) operating within a power range extending from about 50 Watts to about 2000 Watts.

6. A method for removing photoresist material from a substrate as recited in claim 1, wherein the $H_2O$ vapor is disposed as a component of a multiple gas mixture, the multiple gas mixture including either CO, $C_2H_4$, $CO_2$, $CH_4$, Ar, He, or a combination thereof.

7. A method for operating a photoresist stripping chamber, comprising:
    placing a wafer within an internal volume of the photoresist stripping chamber, the wafer having a photoresist material overlying a low k dielectric material, the low k dielectric material having an exposed portion;
    maintaining a temperature of the wafer at less than about 20° C.;
    supplying $H_2O$ vapor to the internal volume of the photoresist stripping chamber;
    applying power to the $H_2O$ vapor to transform the $H_2O$ vapor into a plasma including plasma ions; and
    allowing the plasma ions to activate reactions with the photoresist material, the reactions with the photoresist material acting to remove the photoresist material from the wafer without adversely affecting the low k dielectric material at the exposed portion.

8. A method for operating a photoresist stripping chamber as recited in claim 7, further comprising:
    controlling the plasma to achieve a photoresist material-to-low k dielectric material stripping selectivity of at least 10 to 1.

9. A method for operating a photoresist stripping chamber as recited in claim 7, wherein adversely affecting the low k dielectric material corresponds to increasing an electrical conductivity of the low k dielectric material, altering a geometry of the low k dielectric material, or altering physical properties of the low k dielectric material.

10. A method for operating a photoresist stripping chamber as recited in claim 7, further comprising:
    generating a partial vacuum pressure within the internal volume of the photoresist stripping chamber, the partial vacuum pressure being within a range extending from about 0.001 torr to about 20 torr.

11. A method for operating a photoresist stripping chamber as recited in claim 7, wherein the $H_2O$ vapor is supplied to the internal volume of the photoresist stripping chamber at a flow rate within a range extending from about 50 standard cubic centimeters per minute (sccm) to about 3000 sccm.

12. A method for operating a photoresist stripping chamber as recited in claim 7, wherein the power is defined as a radio frequency (RF) power applied within a range extending from about 50 Watts to about 2000 Watts.

13. A method for operating a photoresist stripping chamber as recited in claim 7, wherein the $H_2O$ vapor is supplied to the internal volume of the photoresist stripping chamber as a component of a multiple gas mixture, the multiple gas mixture including either CO, $C_2H_4$, $CO_2$, $CH_4$, Ar, He, or a combination thereof.

* * * * *